United States Patent [19]

Qian

[11] Patent Number: 5,540,800
[45] Date of Patent: Jul. 30, 1996

[54] INDUCTIVELY COUPLED HIGH DENSITY PLASMA REACTOR FOR PLASMA ASSISTED MATERIALS PROCESSING

[75] Inventor: Xueyu Qian, Milpitas, Calif.

[73] Assignee: Applied Materials, Inc., Santa Clara, Calif.

[21] Appl. No.: 265,596

[22] Filed: Jun. 23, 1994

[51] Int. Cl.$^6$ .............................. C23C 16/48; C23F 1/02; C23F 1/08
[52] U.S. Cl. .............. 156/345; 118/723 R; 118/723 VE; 118/723 I; 118/723 IR; 204/298.34
[58] Field of Search ........................ 156/345; 118/723 R, 118/723 VE, 723 I, 723 IR; 204/298.34

[56] References Cited

U.S. PATENT DOCUMENTS

| | | | |
|---|---|---|---|
| 4,661,304 | 4/1987 | Perkins, Jr. et al. | 376/123 |
| 4,795,529 | 1/1989 | Kawasaki et al. | 156/643 |
| 4,842,683 | 6/1989 | Cheng et al. | 156/345 |
| 4,844,775 | 7/1989 | Keeble | 156/643 |
| 4,872,947 | 10/1989 | Wang et al. | 156/643 |
| 4,948,458 | 8/1990 | Ogle | 156/643 |
| 4,992,665 | 2/1991 | Mohl | 250/423 R |
| 5,122,251 | 6/1992 | Campbell et al. | 204/298.06 |
| 5,234,529 | 8/1993 | Johnson | 156/345 |
| 5,277,751 | 1/1994 | Ogle | 156/64 |
| 5,280,154 | 1/1994 | Cuomo et al. | 219/121.52 |
| 5,346,578 | 9/1994 | Benzing et al. | 156/345 |
| 5,368,710 | 11/1994 | Chen et al. | 204/192.32 |

FOREIGN PATENT DOCUMENTS

| | | |
|---|---|---|
| 0379828A2 | 8/1990 | European Pat. Off. . |
| 0379828A3 | 8/1990 | European Pat. Off. . |
| 0520519A1 | 12/1991 | European Pat. Off. . |
| 0552491A1 | 7/1993 | European Pat. Off. . |
| 0596551A1 | 5/1994 | European Pat. Off. . |
| 2231197 | 11/1990 | United Kingdom . |
| WO92/20833 | 11/1992 | WIPO . |

*Primary Examiner*—W. Robinson H. Clark
*Attorney, Agent, or Firm*—Pete Sgarbossa, Esq.; Michaelson & Wallace

[57] ABSTRACT

The invention is embodied in an inductively coupled plasma reactor including a vacuum chamber for holding a wafer in the interior thereof and capable of containing a plasma gas, and having an RF antenna and an RF power source for supplying RF power to the RF antenna and apparatus for electrically isolating the RF antenna from the RF power source so as to reduce capacitive coupling therebetween. Preferably, the apparatus for isolating the antenna is a transformer having a primary winding connected across the RF power source and a secondary winding connected across the RF antenna. Preferably, the reactor further includes a conductive Faraday shield having plural layers, the Faraday shield being disposed between the RF antenna and the ceiling of the vacuum chamber, the Faraday shield having eddy current-suppressing apertures in each layer thereof facing conductive portions of the shield in an adjacent layer thereof. The ceiling of the vacuum chamber acts as a gas distribution manifold. The inner layer of the ceiling is the shower head of the manifold.

18 Claims, 2 Drawing Sheets

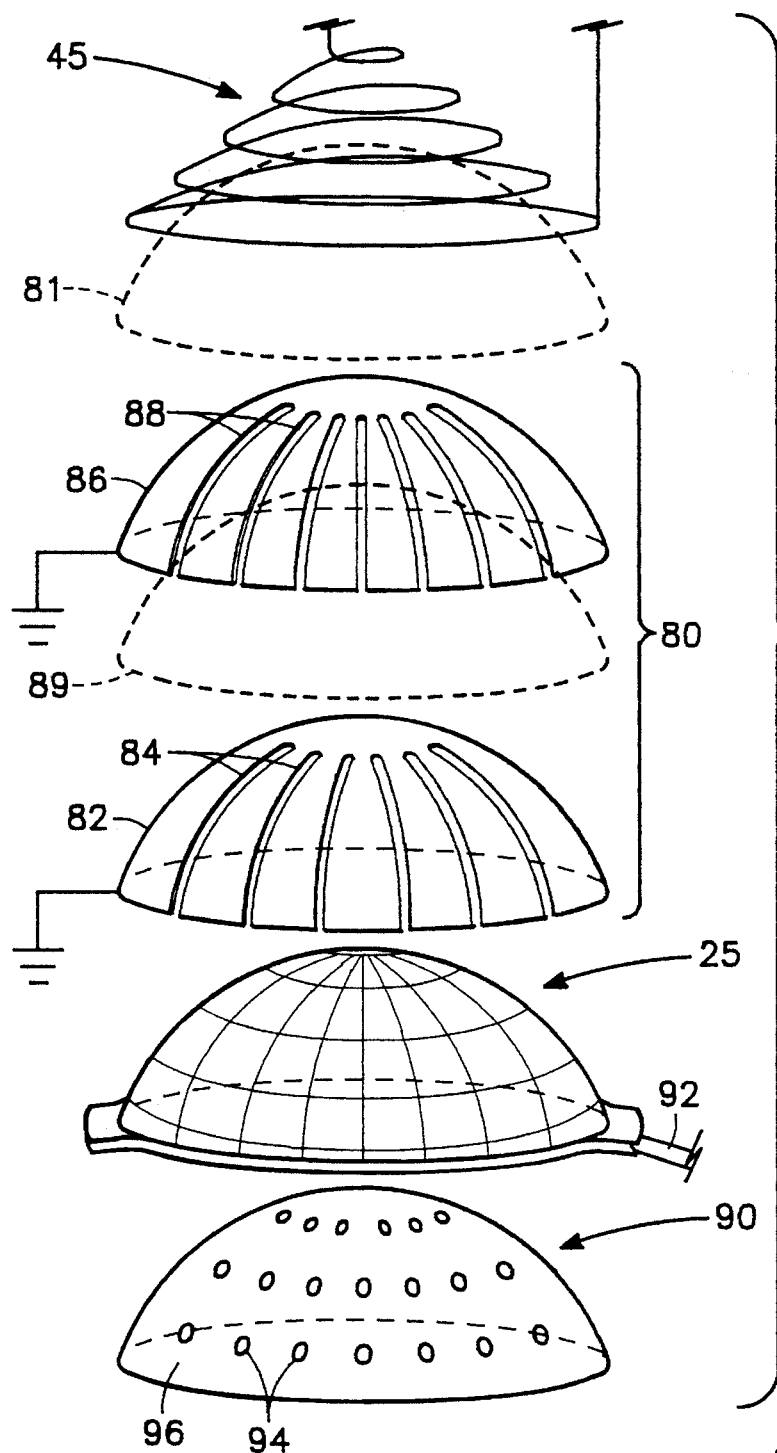
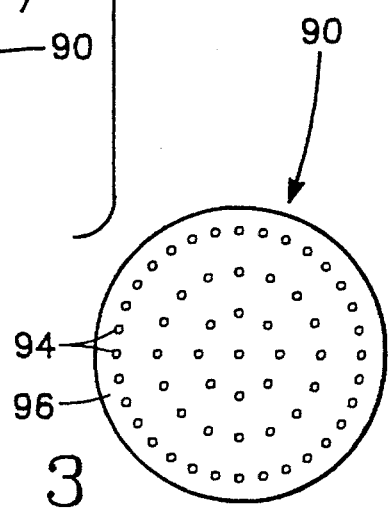
FIG. 2
FIG. 3

INDUCTIVELY COUPLED HIGH DENSITY PLASMA REACTOR FOR PLASMA ASSISTED MATERIALS PROCESSING

BACKGROUND OF THE INVENTION

1. Technical Field

The invention relates to inductively coupled plasma reactors for any suitable plasma assisted materials processing, especially semiconductor wafer processing such as plasma etching, chemical vapor deposition, plasma immersion ion implantation and so forth.

2. Background Art

Fabricating multiple-level semiconductor device structures typically requires selectively etching one material faster than another. Also, a vertical etch profile transfer requires anisotropic etching. For example, sub-half micron polysilicon gate etching requires a vertical profile and an etch selectivity ratio of polysilicon over SiO2 of larger than 50 or 100. In a plasma reactor, reactive chemical species can provide very high selectivity, but very poor etch anisotropy. High energy ions can provide good anisotropy but not selectivity. To achieve anisotropic etch with extremely high selectivity, high density ions with very well-controlled energy distribution are required. In recent years, various high density plasma reactors have been developed.

One common feature of these new generation plasma reactors is the independent control of high density ion generation and ion energy control. One kind of reactor of great interest is the inductively coupled plasma reactor. The plasma in such a reactor is generated inside a vacuum chamber by a coiled RF antenna. By adjusting the RF current in the antenna, the ion density can be controlled. The ion energy is controlled by another RF power, usually called RF bias, connected to the wafer pedestal. However, the ion energy is not mono-energetic. The ion energy distribution is dependent on many factors such as bias power and frequency, ion species and plasma density. The capacitive coupling from the antenna to the plasma can cause plasma potential vibration, thereby widening the ion energy distribution. A broad ion energy distribution results in reduction of etch selectivity. However, all state-of-the-art plasma reactors have some capacitive coupling. The capacitive coupling can cause plasma instabilities and undesirable plasma mode changes as well. Moreover, excessive ion bombardment caused by capacitive coupling on the chamber wall adjacent the RF antenna can increase the number of contaminant particles and chamber wear.

In order to reduce such capacitive coupling, a Faraday shield can be placed between the coil antenna and the plasma. The Faraday shield is a grounded thin conductive layer. The Faraday shield, however, must have thin elongate openings therein lying in directions perpendicular to the windings of the RF coil antenna, in order to suppress any eddy currents which would otherwise tend to be induced in the Faraday shield. These openings, however, tend to admit some electric fields from the coil antenna to the plasma, thereby permitting some capacitive coupling.

A related problem is that capacitive coupling from the RF coil antenna prevents gas distribution near the plasma reactor's vacuum chamber ceiling, particularly where the coil antenna is located in the ceiling itself. The ceiling may be a quartz dome, and the RF coil antenna lying in the ceiling is in a dome shape, as disclosed in U.S. patent application Ser. No. 08/113,776, filed Aug. 27, 1993 by Kevin Fairbairn and Romuald Nowak entitled HIGH DENSITY PLASMA CVD AND ETCHING REACTOR and assigned to the present assignee, the disclosure of which is incorporated herein by reference. If gas distribution is too close to the ceiling, capacitive coupling will cause the gas to ionize inside the distribution apparatus and create distribution apparatus wear and contamination throughout the entire reactor from particles generated in the interior of the gas distribution apparatus.

Typically, the RF antenna on the ceiling is operated at 3 to 7 kV, which is sufficient to cause severe ion bombardment of the interior c,f the gas distribution apparatus. For this reason, gas distribution in such a reactor has been confined to regions near the sides of the wafer or the side walls of the vacuum chamber. Such gas distribution (from the sides of the chamber) may cause ion and neutral non-uniform distribution across the wafer surface. Moreover, a great deal of gas so distributed is wasted because both the gas distribution and the vacuum pump aperture are near the chamber sides, so that much of the gas flows directly from the gas distribution ports to the vacuum pump without ever reacting in the plasma. Such problems would be overcome by distributing gas from the entire ceiling of the vacuum chamber. However, there has seemed to be no way of distributing gas from the ceiling due to the possible plasma generation in the gas distribution apparatus by the capacitive coupling from the coil antenna in the ceiling.

SUMMARY OF THE DISCLOSURE

The invention is embodied in an inductively coupled high density plasma reactor including a vacuum chamber for holding a wafer in the interior thereof and capable of containing a plasma gas, and having all RF antenna, a bias RF electrode and RF power sources for supplying RF power to the RF antenna and RF electrode and apparatus for electrically isolating the RF antenna from the RF power source so as to reduce capacitive coupling to the plasma. Preferably, the apparatus for isolating the antenna is a transformer having a primary winding connected across the RF power source and a secondary winding connected across the RF antenna. Preferably, the reactor further includes a conductive Faraday shield having plural layers, the Faraday shield being disposed between the RF antenna and the ceiling of the vacuum chamber, the Faraday shield having eddy current-suppressing apertures in each layer thereof facing conductive portions of the shield in an adjacent layer thereof.

In a preferred embodiment, the RF antenna is adjacent the vacuum chamber ceiling and the Faraday shield is between the RF antenna and the ceiling of the vacuum chamber. A gas distribution manifold is on an interior surface of the ceiling and has gas distribution orifices facing the interior of the vacuum chamber. Preferably, the ceiling, the antenna, the Faraday shield and the gas distribution manifold are dome-shaped.

BRIEF DESCRIPTION OF THE DRAWINGS

FIG. 2 is an exploded perspective side view of a Faraday shield and gas distribution apparatus employed in the embodiment of FIG. 1.

FIG. 3 is a bottom view of the gas distribution apparatus of FIG. 2.

DETAILED DESCRIPTION OF THE PREFERRED EMBODIMENT

Figure 1:
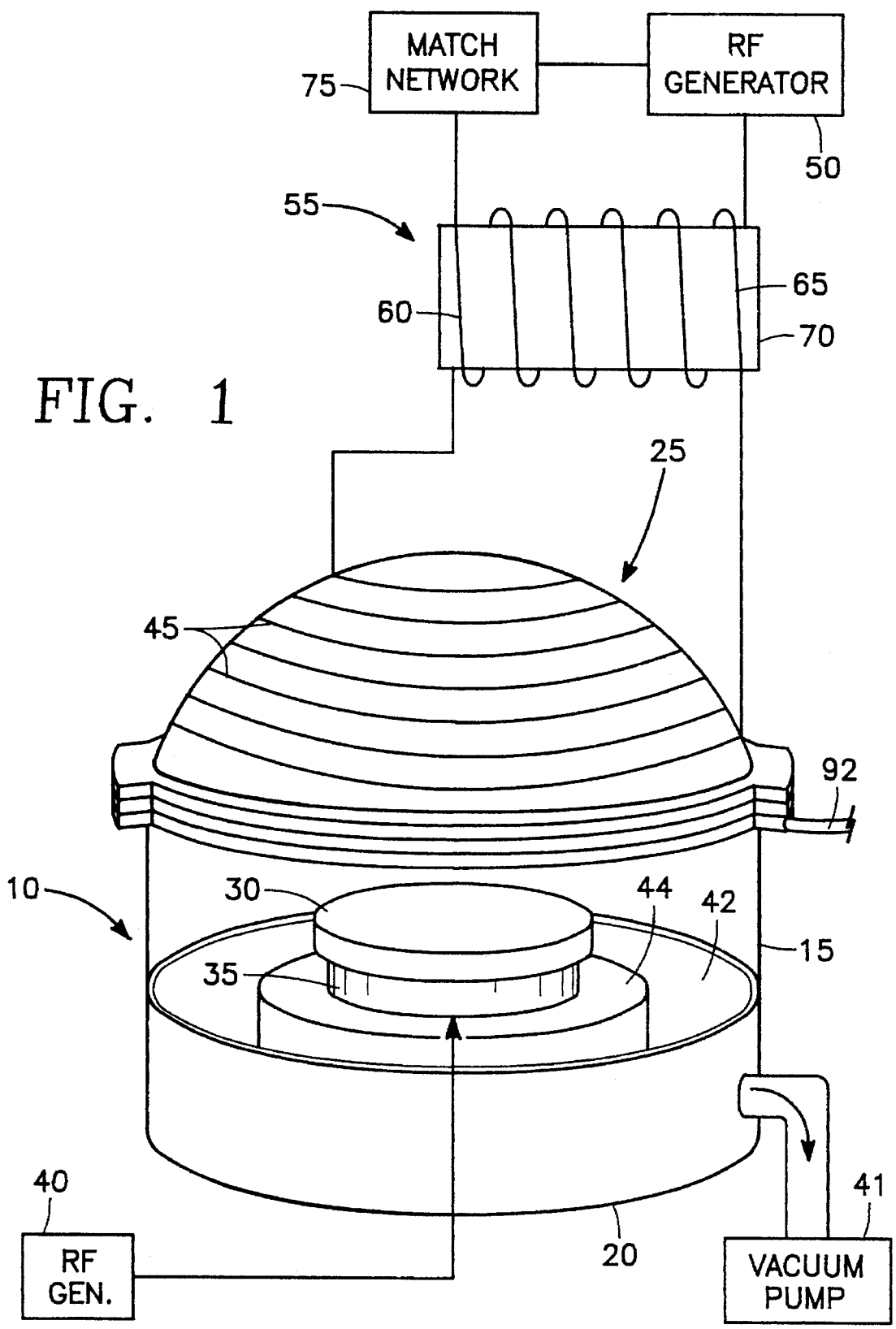
FIG. 1 is a schematic diagram of an inductively coupled plasma reactor embodying the present invention.

The present invention overcomes the foregoing problems by virtually eliminating capacitive coupling in an inductively coupled plasma reactor, and facilitates a new inductively coupled plasma reactor structure in which both the coiled RF antenna and the gas distribution are in the chamber ceiling. The capacitive coupling is reduced by an RF transformer which isolates the RF coil antenna from the RF power source so that the electric potential of the antenna floats relative to the plasma and relative to the chamber walls. The capacitive coupling is also reduced by a dual-layer Faraday shield in which each of the eddy-current-preventing openings in one layer of the shield faces a conductive portion in the other layer of the shield, thereby blocking direct capacitive coupling through the openings in the Faraday shield.

Referring to FIG. 1, an inductively coupled plasma reactor includes a vacuum chamber 10 having a cylindrical side wall 15, a bottom wall 20 and a dome ceiling 25. Typically, the dome ceiling 25 is quartz. A semiconductor wafer 30 is supported over a bias electrode 35. An RF generator 40 applies RF power to the bias electrode 35. The bias electrode 35 is electrically insulated by an insulating block 44. A vacuum pump 41 draws a vacuum through an aperture 42 to maintain a vacuum within the chamber 10. An RF coiled antenna 45 lying on the dome ceiling 25 is a helically coiled conductor wound about the axis of symmetry of the dome ceiling 25 so as to follow the dome contour of the ceiling 25, and receives RF power from an RF generator 50. The vacuum chamber 10 contains a gas which is ionized to become a plasma energized by RF energy inductively coupled from the coiled RF antenna 45. The preferred manner of introducing the gas into the chamber 10 will be described later in this specification.

The RF coil antenna 45 is electrically isolated from the RF generator 50 so that the potential of the antenna 45 floats. For this purpose, a conventional isolation transformer 55 has its primary winding 60 connected across the output of the RF generator 50 and its secondary winding 65 connected across the antenna 45. The primary and secondary windings 60, 65 are wire conductors wound around a cylindrical core 70. A conventional RF matching network 75 of the type well-known in the art matches the output impedance of the RF generator 50 to the input impedance of the antenna 45.

Referring to FIG. 2, a two-layer Faraday shield 80 is located between the ceiling 25 and the coiled antenna 45 in order to suppress capacitive coupling from the antenna 45 to the plasma in the chamber 10. A conventional insulating layer 81 may be employed to electrically insulate the Faraday shield and the coiled antenna 45 from one another. The Faraday shield 80 is formed of a sheet metal, such as copper. The two-layer Faraday shield 80 includes a first conductive layer 82 having a dome shape conforming to the dome ceiling 25. A series of periodically spaced-apart longitudinal apertures or slots 84 in the first conductive layer 82 suppress eddy currents that would otherwise tend to flow circumferentially or laterally around the dome-shaped conductive layer 82. A second dome-shaped conductive layer 86 structurally identical to the first conductive layer 82 and having periodically spaced-apart longitudinal eddy current-suppressing slots 88 overlies the first conductive layer 82. Both conductive layers 82, 86 are grounded and both may be connected together at the top or bottom. They may be separate copper sheets, as shown in the drawing of FIG. 2.

Significantly, the two dome-shaped conductive layers 82, 86 are slightly rotated relative to one another so that the slots 84 in the first latter 82 are offset from the slots 88 in the second layer 86. In this way, the opening through each slot 84 or 88 in a corresponding conductive layer 82, 84 is blocked or covered by a solid portion of the other conductive layer, so that there is no open or unshielded path for an electric field to pass through the Faraday shield 80. Accordingly, the Faraday shield 80 provides far greater suppression of capacitive coupling from the antenna 45 to the plasma in the chamber 10.

The two Faraday shield layers 82, 84 are electrically insulated from one another by an insulating layer 89 of sufficient thickness to prevent arcing between the two layers 82, 84. In this way, the apertures or slots 84, 88 prevent eddy currents from flowing along the direction of the coil antenna, which prevents attenuation of RF energy from the coil antenna by the Faraday shield layers 82, 84. The insulating layer 89 may be on the order of several millimeters, depending upon the RF power applied to the RF coil antenna.

With the isolation of the coil RF antenna 45 provided by the isolation transformer 55 and with the improved shielding provided by the dual-layer Faraday shield 80, capacitive coupling to the plasma in the chamber 10 is suppressed to the extent that gas distribution apparatus may be placed against the ceiling 25 without undue risk of ionizing the gas inside the distribution apparatus. As illustrated in FIGS. 2 and 3, the inner layer of the ceiling 25 is a gas distribution manifold 90. The gas distribution manifold is formed of a material such as quartz and has a gas inlet port 92 and many gas distribution orifices 94 in its bottom surface 96 facing the wafer 30. The orifices 94 are distributed across the gas distribution manifold bottom surface 96 so as to provide uniform gas distribution across the entire surface of the wafer.

While the invention has been described with reference to an inductively coupled plasma reactor in which the inductive-coupling RF antenna is located on a dome-shaped ceiling, the invention is useful with ceilings of other shapes. Moreover, the invention is useful with inductively coupled plasma reactors in which the antenna is not located on or over the ceiling, such as a reactor having an RF coil antenna wound around the vertical cylindrical side walls.

While the invention has been described in detail by specific reference to preferred embodiments, it is understood that variations and modifications thereof may be made without departing from the true spirit and scope of the invention.

What is claimed is:

1. An inductively coupled plasma reactor including a vacuum chamber for holding a wafer in the interior thereof and capable of containing a-plasma gas comprising:

an RF antenna and an RF power source for supplying RF power to said RF antenna; and a transformer having a primary winding connected across said RF power source and a secondary winding connected across said RF antenna for electrically isolating said RF antenna from said RF power source.

2. The reactor of claim 1 further comprising a conductive Faraday shield having plural layers, said Faraday shield being disposed between said RF antenna and said vacuum chamber, said Faraday shield having eddy current-suppressing apertures in each layer thereof facing conductive portions of said shield in an adjacent layer thereof.

3. The reactor of claim 2 further comprising:

a ceiling overlying said vacuum chamber, said RF antenna being adjacent said ceiling and said Faraday shield being located between said RF antenna and the ceiling of said vacuum chamber;

a gas distribution manifold on an interior surface of said ceiling having gas distribution orifices facing the interior of said vacuum chamber.

4. The reactor of claim 3 wherein:

said ceiling has a dome shape with its concave side facing the interior of said vacuum chamber, wherein said RF antenna comprises a helically coiled conductor wound around said dome-shaped ceiling, said eddy current-suppressing apertures lying generally perpendicular to said coiled conductor, said Faraday shield comprises dome-shaped conductive sheets conforming to the dome shape of said ceiling, and said gas distribution manifold has a dome shape conforming to the dome shape of said ceiling, and said gas distribution manifold, said Faraday shield, said RF antenna and said ceiling being nested together.

5. The reactor of claim 4 wherein said Faraday shield comprises a pair of thin conductive dome-shaped sheets.

6. An inductively coupled plasma reactor including a vacuum chamber for holding a wafer in the interior thereof and capable of containing a plasma, comprising:

an RF antenna adjacent said chamber and adapted to be connected to an RF power source, said antenna being capable of irradiating the interior of said chamber;

a conductive Faraday shield having plural layers, said Faraday shield being disposed between said RF antenna and said vacuum chamber, said Faraday shield having eddy current-suppressing apertures in each layer thereof facing conductive portions of said shield in an adjacent layer thereof; and a transformer having a primary winding connected across said RF power source and a secondary winding connected across said RF antenna for electrically isolating said RF antenna from said RF power source.

7. The reactor of claim 6 further comprising:

a ceiling overlying said vacuum chamber, said RF antenna being adjacent said ceiling and said Faraday shield being located between said RF antenna and said vacuum chamber;

a gas distribution manifold on an interior surface of said ceiling having gas distribution orifices facing the interior of said vacuum chamber.

8. The reactor of claim 7 wherein:

said ceiling has a dome shape with its concave side facing the interior of said vacuum chamber, wherein said RF antenna comprises a helically coiled conductor wound around said dome-shaped ceiling, said eddy current-suppressing apertures lying generally perpendicular to said coiled conductor, said Faraday shield comprises dome-shaped conductive sheets coil forming to the dome shape of said ceiling, and said gas distribution manifold has a dome shape conforming to the dome shape of said ceiling, and said gas distribution manifold, said Faraday shield, said RF antenna and said ceiling being nested together.

9. The reactor of claim 7 wherein said Faraday shield comprises a pair of thin conductive dome-shaped sheets.

10. The reactor of claim 6, which further includes an insulating layer between the antenna and the Faraday shield.

11. The reactor of claim 10, in which the Faraday shield includes a plurality of conductive layers and an insulative layer between adjacent conductive layers.

12. In a plasma reactor for use with an applicator for inductively coupling energy into the interior of the reactor, and a source of alternating electrical power, the combination comprising:

an electrical isolator connected to an RF antenna and between a applicator for inductively coupling energy into the interior of the reactor and a source of alternating electrical power, said isolator permitting electrical power to be transmitted from the source to the applicator while minimizing capacitive coupling, wherein said electrical isolator has a primary winding connected across said source and a secondary winding connected across said RF antenna for electrically isolating said RF antenna from said source; and a conductive Faraday shield positioned adjacent the reactor, and between the reactor and the applicator and spaced from the applicator, said shield having spaced plural conductive layers, each layer provided with apertures facing solid portions of an adjacent layer, said apertures being oriented so as to suppress eddy currents within the layers.

13. The combination of claim 12, which further includes a gas distribution manifold within the reactor and adjacent an interior wall thereof opposite the Faraday shield, said manifold having orifices directed toward the interior of the reactor.

14. The combination of claim 12, in which the alternating electrical power is RF, and the electrical isolator is a transformer.

15. The combination of claim 12, in which the reactor is provided with a dome-shaped upper wall; the applicator is provided as a coiled conductor wound about said upper wall; and the Faraday shield generally conforms to the curvature of the upper reactor wall.

16. The combination of claim 15, in which the apertures within the conductive layers of the Faraday shield are elongated in the direction perpendicular to the orientation of the adjacent portion of the applicator conductor.

17. The combination of claim 12, in which an insulator layer occupies the space between the Faraday shield and the applicator.

18. The combination of claim 12, in which an insulator layer occupies the space between adjacent conductive layers of the Faraday shield.

\* \* \* \* \*